(12) United States Patent (10) Patent No.: US 12,693,171 B2

Lu et al. (45) Date of Patent: *Jul. 28, 2026

(54) TEMPERATURE SENSORS

(71) Applicants:SSAB Enterprises, LLC, Mobile, AL (US); Iowa State University Research Foundation, Inc., Ames, IA (US)

(72) Inventors: Meng Lu, Ames, IA (US); Jingjing Qian, Ames, IA (US); Sunday O. Abraham, Bettendorf, IA (US); Randy Petty, West Liberty, IA (US); Matthew J. Werner, Muscatine, IA (US)

(73) Assignees: SSAB Enterprises, LLC, Mobile, AL (US); Iowa State University Research Foundation, Inc., Ames, IA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/636,467

(22) Filed: Apr. 16, 2024

(65) Prior Publication Data

US 2024/0255359 A1 Aug. 1, 2024

Related U.S. Application Data

(63) Continuation of application No. 16/723,445, filed on Dec. 20, 2019, now Pat. No. 11,959,811.

(51) Int. Cl.
*G01K 11/32* (2021.01)
*C21C 5/52* (2006.01)
(Continued)

(52) U.S. Cl.
CPC ............... *G01K 11/32* (2013.01); *C21C 5/52* (2013.01); *F27D 21/0014* (2013.01);
(Continued)

(58) Field of Classification Search
CPC .......... G01K 11/32; G01K 11/12; C21C 5/52;
C21C 2005/5288; F27D 21/0014; G02B
6/02395; H05B 7/148; H10F 77/30
See application file for complete search history.

(56) References Cited

U.S. PATENT DOCUMENTS 4,362,057 A * 12/1982 Gottlieb ................. G01K 11/32
374/E11.015
8,135,247 B2 * 3/2012 Xia ....................... G02B 6/0218
385/12

(Continued)

FOREIGN PATENT DOCUMENTS

CN 103674322 A 1/2016

OTHER PUBLICATIONS

Chen et al., "Review and perspective: Sapphire optical fiber cladding development for harsh environment sensing" Applied Physics Reviews 5, 011102 (2018); Feb. 7, 2018; entire document, especially abstract, p. 12-13 [online] <https://aip.scitation.org/doi/abs/10.1063/1.5010184>.

(Continued)

*Primary Examiner* — Laura Martin
*Assistant Examiner* — Philip L Cotey
(74) *Attorney, Agent, or Firm* — Greenberg Traurig, LLP

(57) ABSTRACT

A temperature sensor according to the disclosure herein includes an optical fiber structured to produce a thermal emission representative of a molten steel into which the temperature sensor is inserted; a cladding layer covering at least a portion of the optical fiber; and a spectrometer configured to receive the thermal emission from the optical fiber and to generate, in response, a radiation spectrum indicative of a temperature of the molten steel.

22 Claims, 4 Drawing Sheets

(51) Int. Cl.

| | |
|---|---|
| *F27D 21/00* | (2006.01) |
| *G01K 11/12* | (2021.01) |
| *G02B 6/02* | (2006.01) |
| *H05B 7/148* | (2006.01) |
| *H10F 77/30* | (2025.01) |

(52) U.S. Cl.
CPC .......... *G01K 11/12* (2013.01); *G02B 6/02395* (2013.01); *H05B 7/148* (2013.01); *H10F 77/30* (2025.01); *C21C 2005/5288* (2013.01)

(56) References Cited

U.S. PATENT DOCUMENTS

| | | | | |
|---|---|---|---|---|
| 9,599,518 | B2 * | 3/2017 | Djeu | G01K 11/32 |
| 9,678,275 | B1 * | 6/2017 | Griffin | G02B 6/262 |
| 10,436,978 | B2 * | 10/2019 | Blue | G02B 6/0288 |
| 11,536,888 | B2 * | 12/2022 | Logunov | G02B 6/0003 |
| 2003/0128944 | A1 | 7/2003 | Skutnik | |
| 2004/0208470 | A1 * | 10/2004 | Janney | G02B 6/02 |
| | | | | 385/144 |
| 2005/0145071 | A1 * | 7/2005 | Cates | C21C 5/4606 |
| | | | | 75/382 |
| 2008/0075412 | A1 * | 3/2008 | Vartuli | G02B 6/021 |
| | | | | 385/12 |
| 2010/0247026 | A1 * | 9/2010 | Xia | G01K 11/3206 |
| | | | | 385/12 |
| 2010/0247027 | A1 * | 9/2010 | Xia | G01D 5/35303 |
| | | | | 385/12 |
| 2013/0057863 | A1 * | 3/2013 | Christiansen | G02B 6/02033 |
| | | | | 385/12 |
| 2015/0276506 | A1 * | 10/2015 | Djeu | G01K 11/32 |
| | | | | 374/161 |
| 2015/0377710 | A1 * | 12/2015 | Goda | G01J 5/004 |
| | | | | 250/338.3 |
| 2018/0003571 | A1 * | 1/2018 | Monro | G02B 6/02123 |
| 2018/0045883 | A1 * | 2/2018 | Yin | C30B 29/28 |
| 2018/0275339 | A1 * | 9/2018 | Blue | G02B 6/02076 |
| 2019/0391356 | A1 * | 12/2019 | Bae | G02B 6/4486 |
| 2020/0393308 | A1 * | 12/2020 | Ichihashi | G01K 11/20 |

OTHER PUBLICATIONS

International Search Report and Written Opinion of application No. PCT/US20/66184, dated Apr. 23, 2021, 10 pgs.

Liu et al., "Growth of well-arrayed ZnO nanorods on thinned silica fiber and application for humidity sensing" vol. 20, Issue 17, pp. 19404-19411 (2012); Aug. 9, 2012; entire document, especially abstract, p. 19405 [online] <https://www.osapublishing.org/oe/fulltext.cfm?uri=oe-20-17-19404&id=240522>27-26-38125>.

Turner, Paul et al., Application of a Man-Less, On-Demand Immersion Optical Temperature Measurement Device at the EAF, AISTech 2019—Proceedings of the Iron & Steel Technology Conference, May 6-9, 2019, Pittsburgh, PA, USA, 14 pgs.

Wang, Dr. Anbo, Optical Fiber High Temperature Sensor Instrumentation for Energy Intensive Industries, Virginia Polytechnic Institute & State University, Nov. 2006, 362 pgs.

* cited by examiner

TEMPERATURE SENSORS

CROSS-REFERENCE TO RELATED APPLICATION

This application is a Continuation of U.S. patent application Ser. No. 16/723,445 filed Dec. 20, 2019, the contents of which are incorporated in their entirety and for all purposes.

BACKGROUND

Electric arc furnaces (EAFs) are used in some steel making processes, during which scrap metal is melted and undesired impurities are removed. During production, the temperature of the steel is preferably kept in a specific range to improve the quality of the resulting steel. Conventional temperature sensors, such as thermocouples, have been used to measure the temperature of steel in an EAF. However, such sensors can only withstand the intense temperatures of molten steel for a few minutes before they melt or are otherwise destroyed during the measurement process and are discarded after a single use. As a result, conventional temperature sensors can only obtain one very brief temperature reading. Put differently, conventional sensors are not capable of continuously measuring the temperature of molten steel over prolonged periods of time. It is therefore necessary to repeat the temperature measurement with a new sensor each time a subsequent temperature measurement is desired. As a result, multiple conventional sensors are needed for each heat and several—sometimes as many as ten or more—are needed for each steel run.

DETAILED DESCRIPTION OF THE INVENTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the claims. Furthermore, in the detailed description of the present invention, numerous specific details are set forth in order to provide a thorough understanding of the present invention. However, it will be obvious to one of ordinary skill in the art that the present invention may be practiced without these specific details. In other instances, well known methods, procedures, components, and circuits have not been described in detail as not to unnecessarily obscure aspects of the present invention.

Generally speaking, various embodiments provide for a temperature sensor that is able to continuously monitor the temperature of steel in an electric arc furnace or the like, and related systems and methods. In some embodiments, the temperature sensor includes a sapphire fiber encased within a nanoporous cladding, which together can withstand the intense temperatures of molten steel over longer periods of time, thereby permitting multiple temperature readings to be taken.

Figure 1:
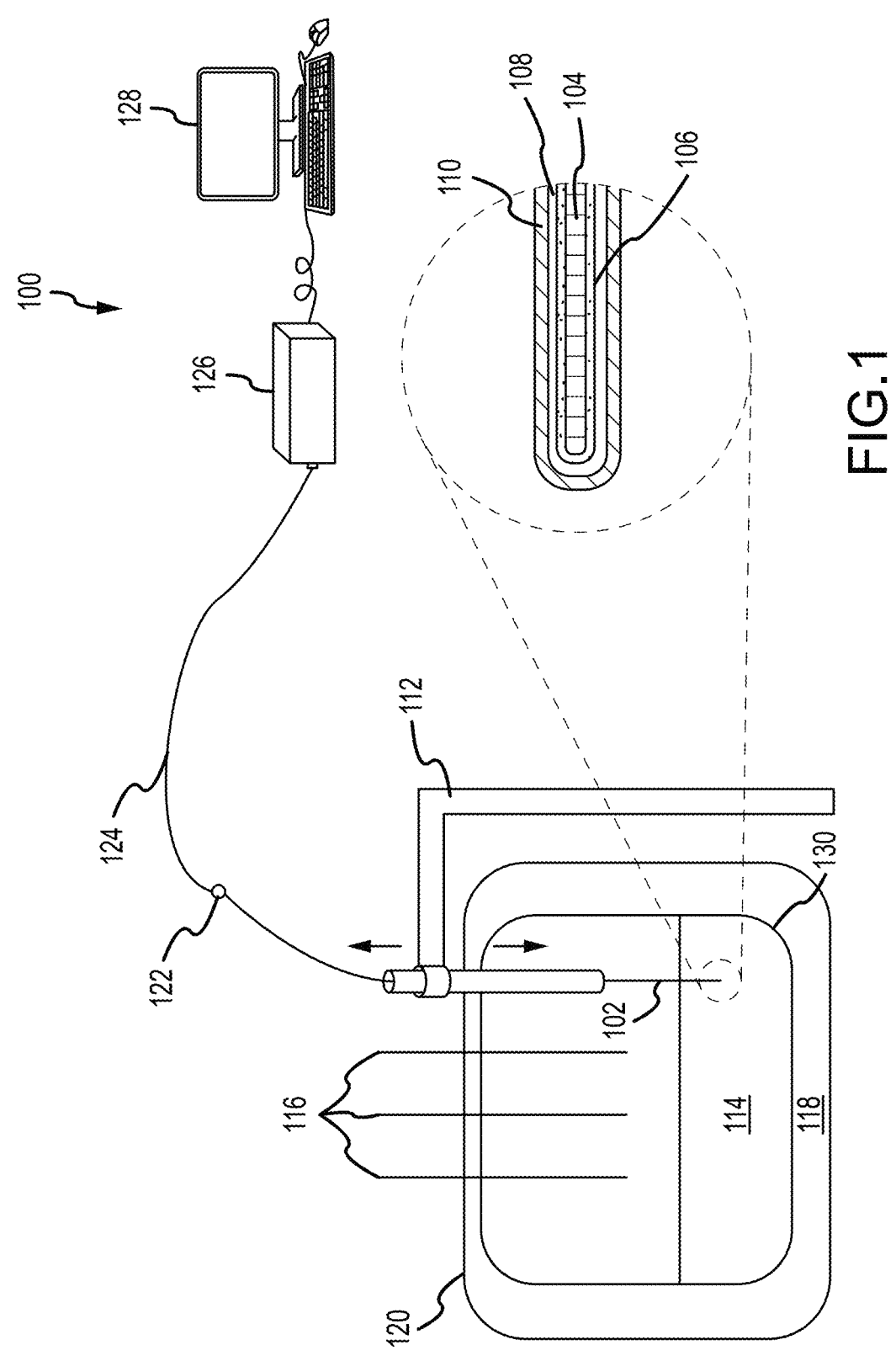
FIG. 1 is a schematic view of an embodiment of a system for measuring temperature in an electric arc furnace in accordance with the present disclosure.

FIG. 1 is a schematic diagram of a system 100 for measuring temperature in an electric arc furnace, in accordance with various embodiments of the present disclosure. In the illustrated embodiment, the system 100 includes an electric arc furnace (EAF) 120 or other similar apparatus for melting metal into molten steel 114. The EAF 120 may include one or more electrodes 116, a refractory shell 118 and a tapping port 130. The EAF may also include an arm 112 for lowering a temperature sensor 102 into the molten steel.

The system 100 also includes a temperature sensor 102 that is selectively positionable within the EAF 120. For example, the system 100 may include a mechanical arm 112 that is positioned and configured to selectively lower the temperature sensor 102 into, and raise it out of, the molten steel 114. In some embodiments, the temperature sensor 102 comprises an optical fiber 104 having a nanoporous cladding layer 106, which may be bonded to the surface of the fiber 104. The optical fiber may be a sapphire fiber suitable for high temperature applications due to its corrosion resistance and stability up to 2,000° C. For example, some sapphire fibers can withstand corrosive (e.g., oxidizing) environments while experiencing little or no damage to the material (e.g., chemically or physically) and can operate at temperatures in excess of 1500° C. In some embodiments, the sapphire fiber may have a diameter of 400 micrometers to 500 micrometers, and in some further embodiments, the sapphire fiber may have a diameter of about 425 nanometers. In some embodiments, the nanoporous cladding layer comprises an alumina coating. However, it should be appreciated that the cladding layer 106 may be made of any suitable material, so long as the material is sufficiently corrosion resistant and stable at temperatures up to 1900° C. The nanoporous cladding layer 106 may be a refractory material, such as a ceramic material. In some embodiments, the nanoporous cladding layer 106 may be $SiO_2$, $Ti_2$, $ZnO_2$, $ZrO_2$ or a combination thereof. As used herein, "nanoporous" means having openings (pores) and/or interstitial spaces with dimensions of less than 1 micrometer. In some embodiments, the refractive index of the sapphire fiber 104 is less than the refractive index of the nanoporous cladding layer 106. The cladding layer 106 may help confine the thermal emission of the sapphire fiber 104 and provide improved stability of the thermal emission detected by the spectrometer 126. The porosity of the cladding layer allows for thermal expansion without cracking due to thermal shock during use. Additional details regarding the nanoporous alumina cladding layer may be found in FIGS. 3a-3c, described in further detail below.

In some embodiments, the temperature sensor 102 may also include a refractory housing 110 disposed around the fiber 104. The refractory housing 110 protects the fiber 104 from the extreme conditions of the molten steel. In some embodiments, the refractory material comprises alumina, which has certain thermal stability and corrosion resistance. The refractory housing may also be made of any other suitable material, so long as the material is sufficiently corrosion resistant and stable at temperatures up to 1900° C. In some embodiment, the thickness of the refractory housing 110 is about 4 mm.

Further, a gap 108, e.g., an air gap, may be present between the refractory housing 110 and the sapphire fiber 104. Such a gap may help confine the thermal emission of the sapphire fiber 104 and provide improved stability of the thermal emission detected by the spectrometer 126. It also allows for thermal expansion of the sapphire fiber 104 during use. In some embodiments, a nanoporous cladding layer may not be included on the sapphire optical fiber 104. In the illustrated embodiment, the air gap is about 2.8 mm.

In some embodiments, the temperature sensor 102 may be coupled to a fiber connector 122. The fiber connector 122 may in turn be coupled to a multimode fiber 124, which may further be coupled to a spectrometer 126. The spectrometer 126 is configured to interpret the color and intensity of the light carried along sensor 102, fiber connector 122 and multimode fiber 124 and generate a corresponding data signal that is indicative of a temperature of the molten steel 114. The spectrometer 126 may further be communicatively coupled with, and provide the temperature signal to, a computer 128 or other similar data processing device, such as a control system for the EAF 120.

In operation, the temperature sensor 102 is introduced into the molten steel 114 in the electric arc furnace 120, e.g., by the mechanical arm 112. The temperature of the molten steel is generally 1540° C. to 1750° C. during operation. When exposed to high temperature, the sapphire optical fiber 104 and/or the refractory 110 produce thermal emission having a color and/or intensity that is indicative of the temperature of the molten steel 114. The sapphire optical fiber 104 couples a corresponding thermal emission (i.e., photons) from the top of the sensor 102. The thermal emission travels out of the sensor through the multimode fiber 124 to the spectrometer 126, where a gray body radiation spectrum of the thermal emission is obtained. The spectrum is provided to the computer 128, which collects a plurality of readings at a rate of about one spectrum per second in some embodiments. The temperature sensor may be in contact with the molten steel for at least 10 minutes in some embodiments. The thermal emission of the sapphire fiber 104 is dependent on the temperature of the electric arc furnace 120. Thus, the spectra may be analyzed to obtain the temperature of the molten steel 114 in the electric arc furnace. Due to the stability of the temperature sensor 102 in extreme environments (e.g., corrosive, high temperature environments), the temperature sensor is capable of taking continuous temperature measurements during the steel making process.

Figure 2:
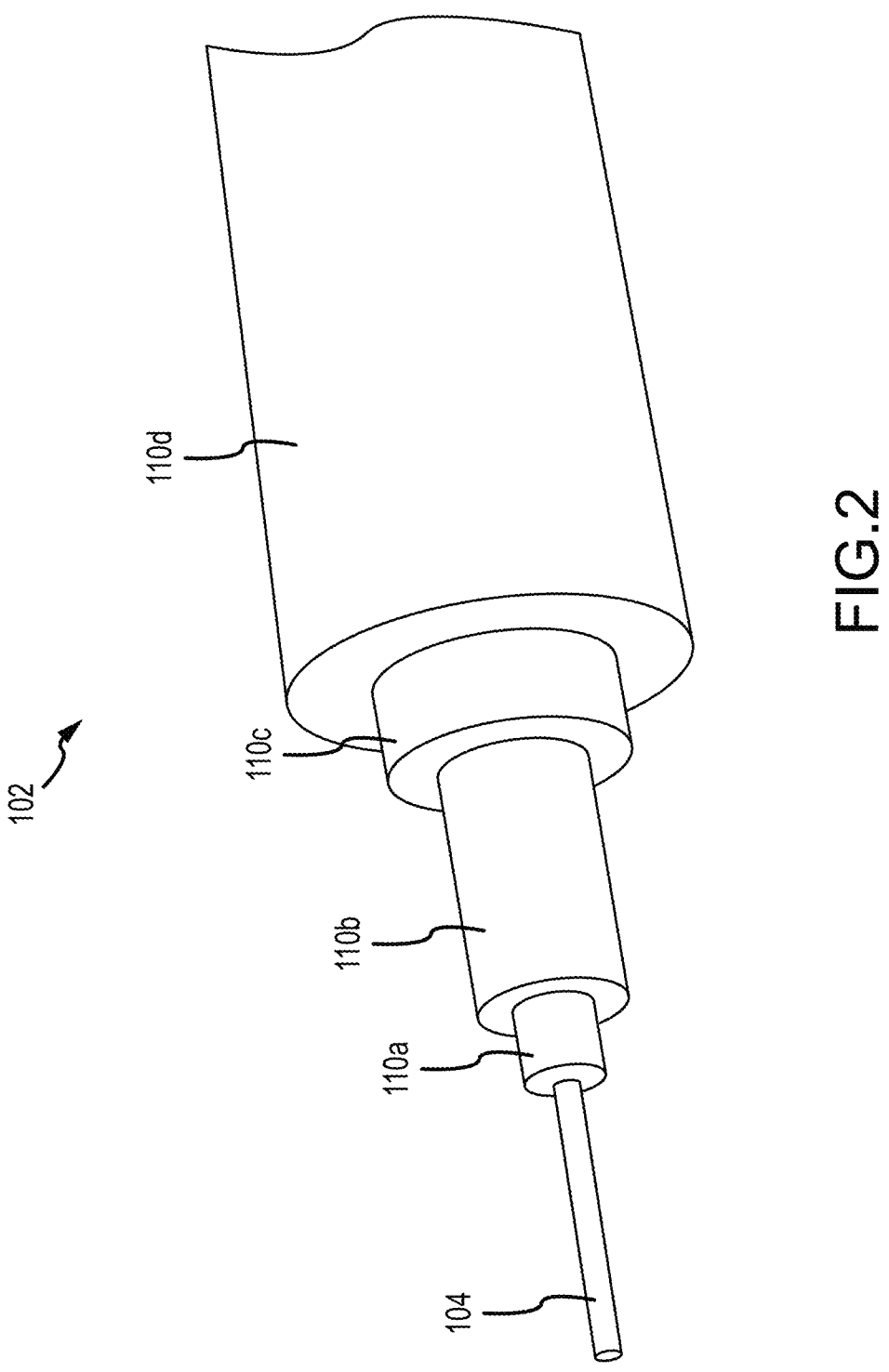
FIG. 2 is a side view of an embodiment of a temperature sensor in accordance with the present disclosure.

FIG. 2 is a schematic of a temperature sensor 102 having multiple layers of refractory housing 110, in accordance with various embodiments. In the illustrated embodiment, the refractory housing 110 has four alumina layers (110a, 110b, 110c, 110d) of increasing thickness. The first layer 110a closest to the sapphire fiber 104 is the thinnest layer. In the illustrated embodiment, layer 110a is about 2 millimeters in thickness and layer 110b is about 4 millimeters in thickness. In the illustrated embodiment, the layers are arranged in such a manner to minimize thermal shock and prevent cracking of the refractory housing during use. The refractory housing may have any suitable number of layers, including a single layer. The layers may have any suitable thickness.

Figures 3A, 3B, 3C:
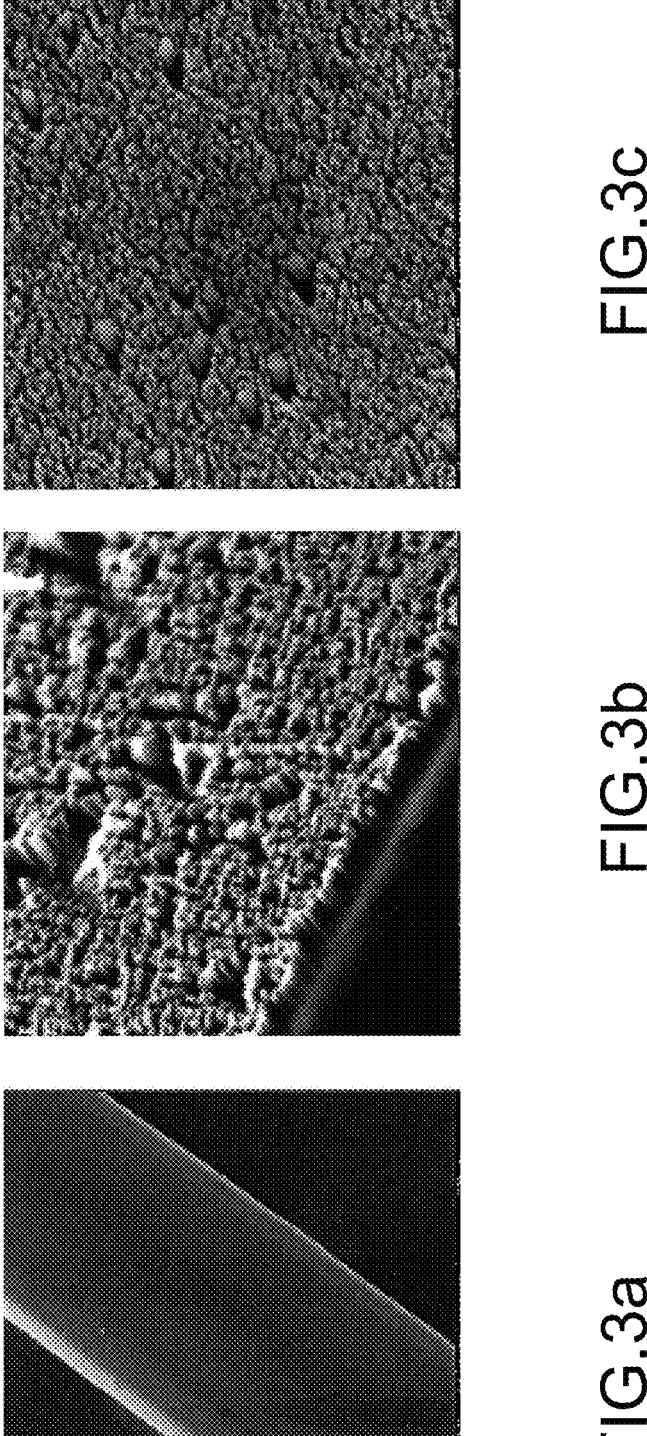
FIG. 3a is a scanning electron micrograph of an embodiment of a nanoporous cladding layer on an optical fiber in accordance with the present disclosure.
FIG. 3b is a scanning electron micrograph of an embodiment of a nanoporous cladding layer on an optical fiber in accordance with the present disclosure.
FIG. 3c is a scanning electron micrograph of an embodiment of a nanoporous cladding layer on an optical fiber in accordance with the present disclosure.

FIGS. 3a-3c show scanning electron micrographs (SEMs) showing details of an example nanoporous alumina cladding layer 106, in accordance with various embodiments. FIG. 3a shows a view of the sapphire fiber 104 with a continuous nanoporous alumina cladding layer 106. The cladding layer is generally free of defects such as cracks. FIGS. 3b and 3c show enlarged views of the cladding layer 106. As shown, the nanoporous cladding layer 106 is composed of nanorod-like structures extending out from the surface of the fiber 104. There are voids (i.e., porosity) between the rods. The structure of the cladding layer 106 (e.g., the porosity and nanorod-like structures) allows for the cladding layer 106 to expand during operation (e.g., when heated) without cracking and/or delaminating. In the illustrated embodiment, the cladding layer 106 has a porosity of about 30%. In some embodiments the nanoporous cladding layer has a porosity of at least 25%. In some embodiments the nanoporous cladding layer has a porosity of at least 28%. In some embodiments the nanoporous cladding layer has a porosity of at least 30%. In some embodiments, the nanoporous cladding layer has a porosity of 25 to 30%. In some embodiments, the porosity of the cladding layer 106 is sufficiently high to allow for thermal expansion of the rod-like structures during heating. In the illustrated embodiment, the nanoporous cladding layer 106 is about 2 micrometers in thickness. The nanoporous cladding layer may be any suitable thickness, provided it is sufficiently thick to confine the thermal emission from the sapphire fiber, and thin enough that the nanorods do not clump together. In some embodiments, the nanoporous cladding layer 106 may be less than or equal to 8 micrometers.

Figure 4:
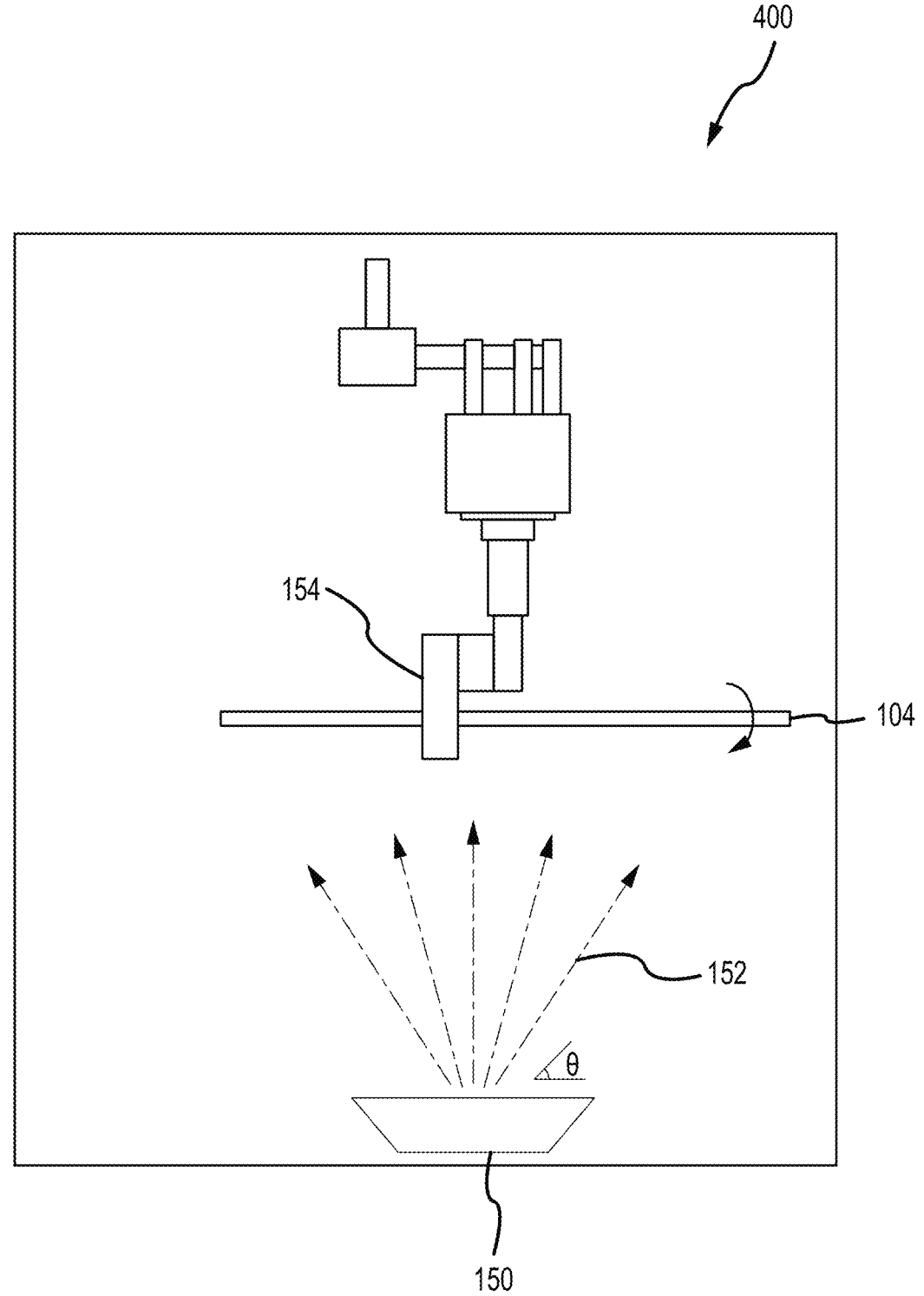
FIG. 4 is a schematic view of an embodiment of a system for depositing a nanoporous cladding layer on an optical fiber.

FIG. 4 is a schematic of a deposition system 400 for depositing a nanoporous coating on a fiber, in accordance with various embodiments. In the illustrated embodiment, the deposition system 400 includes an evaporation source 150, which contains the material to be deposited (e.g., alumina). The fiber 104 is positioned above the evaporation source 150, and is held by an arm 154. During deposition, the source 150 is heated by an electron beam under vacuum in order to evaporate the deposition material (e.g., alumina) and deposit it on the surface of the fiber 104. This evaporation creates an evaporation flux 152. The evaporation source 150 of the deposition material and the sapphire fiber 104 form an angle (θ). In order to achieve the desired structure of the nanoporous cladding layer 106, the angle (θ) may be equal to or less than 45°. In the illustrated embodiment, the angle (θ) is between 2° and 5°. In some embodiments, the angle (θ) may be equal to or less than 30°. In some embodiments, the angle (θ) may be equal to or less than 20°. In some embodiments, the angle (θ) may be equal to or less than 10°. In some embodiments, the angle (θ) may be equal to or less than 7°. In some embodiments, the sapphire fiber may be parallel to the evaporation source. The arm 154 rotates the fiber 104 during deposition to ensure an even coating (the rotation direction is indicated by an arrow in FIG. 4). In some embodiments, the fiber rotates at a speed of about 10 to 60 revolutions per minute. In some embodiments, the deposition rate is 10 to 40 Å/second.

The foregoing disclosure described systems and methods for measuring the temperature of steel in in an electric arc furnace. However, as will be appreciated by those skilled in the art, the systems and methods of the present disclosure may be applicable to other high temperature metal manufacturing processes (e.g., Al, FeNb, Si, FeSi, FeCr, Mn, FeMn, FeMo, FeV, Cu, Ni).

Thus, various embodiments as described herein provide a method for continuously and accurately measuring the temperature of an electric arc furnace. The temperature sensors described herein may have a sapphire optical fiber and a refractory housing. These robust sensors are capable of continuously measuring temperature while withstanding direct contact with molten steel, which enables better process control, which leads to higher quality steel. The temperature sensors described herein may be used for multiple runs in an electric arc furnace.

The FIGURES constitute a part of this specification and include illustrative embodiments of the present disclosure and illustrate various objects and features thereof. In addition, any measurements, specifications and the like shown in the FIGURES are intended to be illustrative, and not restrictive. Therefore, specific structural and functional details disclosed herein are not to be interpreted as limiting, but merely as a representative basis for teaching one skilled in the art to variously employ the present invention.

Among those benefits and improvements that have been disclosed, other objects and advantages of this invention will become apparent from the following description taken in conjunction with the accompanying FIGURES. Detailed embodiments of the present invention are disclosed herein; however, it is to be understood that the disclosed embodiments are merely illustrative of the invention that may be embodied in various forms. In addition, each of the examples given in connection with the various embodiments of the invention is intended to be illustrative, and not restrictive.

Throughout the specification and claims, the following terms take the meanings explicitly associated herein, unless the context clearly dictates otherwise. The phrases "in one embodiment" and "in some embodiments" as used herein do not necessarily refer to the same embodiment s), though it may. Furthermore, the phrases "in another embodiment" and "in some other embodiments" as used herein do not necessarily refer to a different embodiment, although it may. Thus, as described below, various embodiments of the invention may be readily combined, without departing from the scope or spirit of the invention.

In addition, as used herein, the term "or" is an inclusive "or" operator, and is equivalent to the term "and/or," unless the context clearly dictates otherwise. The term "based on" is not exclusive and allows for being based on additional factors not described, unless the context clearly dictates otherwise. In addition, throughout the specification, the meaning of "a," "an," and "the" include plural references, unless the context clearly dictates otherwise. The meaning of "in" includes "in" and "on", unless the context clearly dictates otherwise.

While various embodiments of the new technology described herein have been described in detail, it is apparent that modifications and adaptations of those embodiments will occur to those skilled in the art. However, it is to be expressly understood that such modifications and adaptations are within the spirit and scope of the presently disclosed technology.

What is claimed is:

1. A temperature sensor comprising:
an optical fiber structured to produce a thermal emission representative of a molten steel into which the temperature sensor is inserted;
a cladding layer covering at least a portion of the optical fiber;
a refractory housing covering at least a portion of the cladding layer, wherein the refractory housing includes at least two layers of increasing thickness arranged from an inner layer closest to the optical fiber to an outer layer; and
a spectrometer configured to receive the thermal emission from the optical fiber and to generate, in response, a radiation spectrum indicative of a temperature of the molten steel.

2. The temperature sensor of claim 1, wherein the cladding layer is nanoporous.

3. The temperature sensor of claim 1, wherein the cladding layer comprises a refractory material.

4. The temperature sensor of claim 3, wherein the refractory material is a ceramic material.

5. The temperature sensor of claim 4, wherein the ceramic material is selected from the group consisting of: $SiO_2$, $TiO_2$, $ZnO_2$, and $ZrO_2$.

6. The temperature sensor of claim 1, further comprising an air gap between an end of the optical fiber and an end of the cladding layer, wherein the air gap surrounds the cladding layer and separates the cladding layer from the refractory housing.

7. The temperature sensor of claim 1, wherein a refractive index of the optical fiber is less than a refractive index of the cladding layer.

8. The temperature sensor of claim 1, wherein the cladding layer comprises a thickness of at least 2 micrometers.

9. The temperature sensor of claim 1, wherein the cladding layer comprises a porosity of at least 25% of a total volume of the cladding layer.

10. The temperature sensor of claim 1, wherein the optical fiber is configured to collect a plurality of readings of a temperature of molten steel over a period of time.

11. The temperature sensor of claim 10, wherein the temperature of the molten steel is 1540° C. to 1750° C.

12. The temperature sensor of claim 10, wherein the period of time is at least 10 minutes.

13. A temperature sensor comprising:
a sapphire optical fiber structured to produce a thermal emission in response to exposure to a heated material;
a spectrometer coupled to the sapphire optical fiber and configured to generate a radiation spectrum based on the thermal emission;
a cladding layer proximate the optical fiber, the cladding layer comprising a nanoporous material; and
a multi-layered refractory housing covering at least a portion of the cladding layer.

14. The temperature sensor of claim 13, wherein the heated material is molten steel, and a temperature of the molten steel is indicated by the radiation spectrum.

15. The temperature sensor of claim 14, wherein the temperature of the heated material is at least 1540° C.

16. The temperature sensor of claim 14, wherein temperature sensor is capable of exposure to the heated material for a period of at least 10 minutes.

17. The temperature sensor of claim 13, wherein the cladding layer comprises a refractory material.

18. The temperature sensor of claim 17, wherein the refractory material is a ceramic material.

19. The temperature sensor of claim 13, wherein an air gap surrounds a distal end of the cladding layer, the air gap separating the distal end the cladding layer from a distal end of the refractory housing.

20. A temperature sensor comprising:
an optical fiber structured to produce a thermal emission representative of a heated material into which the temperature sensor is inserted;

a nanoporous layer covering at least a portion of the optical fiber;

a multi-layered refractory housing covering at least a portion of the nanoporous layer; and a spectrometer configured to receive the thermal emission from the optical fiber and to generate, in response, a radiation spectrum indicative of a temperature of the heated material.

21. The temperature sensor of claim 20, wherein the temperature sensor is capable of exposure to the heated material for a period of at least 10 minutes and at a temperature of 1900° C.

22. The temperature sensor of claim 20, further comprising an air gap fully-circumferentially around the nanoporous layer, the air gap separating the nanoporous layer from the refractory housing.

\* \* \* \* \*